United States Patent [19]
Tobben et al.

[11] Patent Number: 6,015,988
[45] Date of Patent: Jan. 18, 2000

[54] MICROSTRUCTURE AND METHODS FOR FABRICATING SUCH STRUCTURE

[75] Inventors: Dirk Tobben, Fishkill, N.Y.; Peter Weigand, Unterhaching, Germany

[73] Assignee: Siemens Aktiengesellschaft, Munich, Germany

[21] Appl. No.: 09/197,391

[22] Filed: Nov. 20, 1998

Related U.S. Application Data

[62] Division of application No. 08/829,255, Mar. 31, 1997.
[51] Int. Cl.⁷ .................................................. H01L 29/72
[52] U.S. Cl. ........................................... 257/308; 257/532
[58] Field of Search ..................................... 257/308, 532

[56] References Cited

U.S. PATENT DOCUMENTS 5,206,787   4/1993   Fujioka ................................... 257/308

*Primary Examiner*—Edward Wojciechowicz
*Attorney, Agent, or Firm*—Stanton C. Braden

[57] ABSTRACT

A method for forming a microstructure includes photolithographically forming a vertically extending post on a portion of a surface of a substrate to provide a first structure. A flowable, sacrificial material is deposited over a surface of the first structure. The flowable, sacrificial materially flows off the top surface and sidewall portions of the post onto adjacent portions of the surface of the substrate to provide a second structure. A non-sacrificial material is deposited over a surface of the second structure. The non-sacrificial material is deposited to conform to the surface of the second structure. The non-sacrificial is deposited over the sacrificial material, over the sidewall portions and over the top surface of the post. The deposited sacrificial material is selectively removed while the non-sacrificial material remains to form a third structure with a horizontal member provided by the non-sacrificial material. The horizontal member is supported a predetermined distance above the surface of the substrate by a lower portion of the post. The flowable material is a flowable oxide, for example, hydrogensilsesquioxane glass, and the post has a width less than 20 μm. The resulting structure, formed with a single photolithographic step, is used for supporting a capacitor deposited over it. The capacitor is formed as a sequence of deposition steps; i.e., depositing a first conductive layer over a surface of the support structure; depositing a dielectric layer over the conductive layer; and depositing a second conductive layer over the dielectric layer.

9 Claims, 8 Drawing Sheets

MICROSTRUCTURE AND METHODS FOR FABRICATING SUCH STRUCTURE

This is a divisional, of application Ser. No. 08/829,255 filed Mar. 31, 1997.

BACKGROUND OF THE INVENTION

This invention relates generally to microstructure and, more particularly, to microstructure adapted for use in a monolithic structure with a semiconductor integrated circuit.

As is known in the art, microstructures have been suggested for use in a wide range of applications, such as in accelerometers, bolometers, and transducers.

As is also known in the art, semiconductor integrated circuits, such as dynamic random access memories (DRAMs) include capacitors for storage of charge. As the size of the DRAM cell is reduced, it becomes difficult to form capacitors having a sufficient capacitance. This is because the capacitance is determined by, inter alia, the surface area of the plates forming the capacitor.

Generally, existing capacitors include a pair of conductive layers, typically doped polycrystalline silicon disposed therebetween a dielectric layer comprised of an oxide film, a nitride film, a combination thereof, or high dielectric material, such as $Ta_2O_5$. As reported in U.S. Pat. No. 5,543,346, one technique used to increase the surface area of the plates of the capacitor is to form the polycrystalline layer as a multi-level structure and with spacers having a pin shape, a cylindrical shape, or a rectangular frame shape extending through the multi-layer structure. While the pin-shaped capacitor described therein may be useful in some application, it requires a relatively complex fabrication procedure. Further, many such fabrication techniques for silicon-based microstructure rely on doped polycrystalline silicon and the etching selectivity between materials having different doping concentrations. They thus require the use of such doping techniques as ion implantation. Further, the resulting structures are highly electrically conductive thereby limiting their applications.

SUMMARY OF THE INVENTION

In accordance with one feature of the invention, a vertically extending post is formed on a portion of a surface of a substrate to provide a first structure. A flowable, sacrificial material is deposited over a surface of the first structure. The flowable, sacrificial materially flows off the top surface and sidewall portions of the post onto adjacent portions of the surface of the substrate to provide a second structure. A non-sacrificial material is deposited over a surface of the second structure. The non-sacrificial material is deposited to conform to the surface of the second structure. The non-sacrificial is deposited over the sacrificial material, over the sidewall portions, and over the top surface of the post. The deposited sacrificial material is selectively removed while the non-sacrificial material remains to form a third structure with a horizontal member provided by the non-sacrificial material. The horizontal member is supported a predetermined distance above the surface of the substrate by a lower portion of the post.

With such an arrangement, a microstructure is formed with only two photolithographic step; i.e., the step used to form the post and the step to form the final microstructure. Further, the structure is a dielectric structure suitable for a wide range of applications.

In one embodiment, the flowable material is a flowable oxide, for example, hydrogensilsesquioxane glass, (an undoped glass) and the post has a width less than 20 $\mu$m.

In accordance with another feature of the invention, a method for forming a capacitor is provided. Such method includes the steps of: providing a substrate; forming a support structure extending vertically from a surface of the substrate; and depositing the capacitor on surface portions of the vertically extending support structure.

In another embodiment, the capacitor is formed by a sequence of steps, such steps comprising: depositing a first conductive layer over a surface of the support structure; depositing a dielectric layer over the conductive layer; and depositing a second conductive layer over the dielectric layer.

In another embodiment, the first conductive layer is formed in electrical contact with the doped region.

In accordance with yet another feature of the invention, a structure is provided comprising: a substrate; a support structure extending vertically from a surface of the substrate; and a capacitor disposed on surface portions of the vertically extending support structure. The capacitor comprises: a first conductive layer disposed over a surface of the support structure; a dielectric layer disposed over the conductive layer; and a second conductive layer disposed over the dielectric layer.

In accordance with another embodiment of the invention, a doped region is disposed in the substrate and the first conductive layer is in electrical contact with the doped region.

In accordance with another feature of the invention, the support structure is provided comprising: a vertically extending post disposed on a portion of a surface of the substrate; and a horizontal member supported a predetermined distance above the surface of the substrate a lower portion of the post. The post and horizontal member is a dielectric material, preferably, silicon dioxide. The post has a bottom portion width less than 20 $\mu$m.

In yet another embodiment, the support structure includes a second horizontal member supported above the first horizontal member a predetermined distance by the post.

BRIEF DESCRIPTION OF THE DRAWINGS

Other features of the invention, as well as the invention itself, will become more readily apparent from the following detailed description taken together with the accompanying drawings, in which.

DESCRIPTION OF THE INVENTION

The invention relates to microstructures having a given overall dimension. For purposes of illustration, the invention is described in the context of the using a microstructure as the basis of a capacitor, such as those employed in a memory cell of a memory device. Such memory device, for example, includes a dynamic random access memory (DRAM), synchronous DRAM, or static random access memory (SRAM). However, the invention has broader applications. For example, the invention is applicable to the fabrication of microstructures in general. In particular, the invention is applicable to fabricating a microstructure resulting in larger surface area without increasing its overall dimensions.

Figure 1:
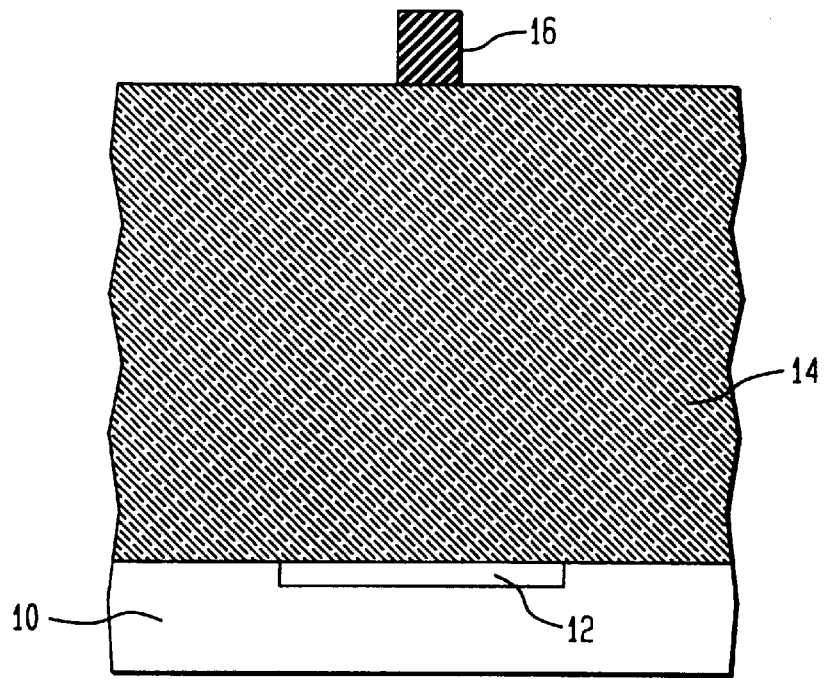
FIGS. 1–10 are cross sectional diagrammatical sketches of a structure manufactured in accordance with the invention at various steps in such manufacture thereof; and, FIGS. 11–15 are cross sectional diagrammatical sketches of a structure manufactured in accordance with an alternative embodiment of the invention at various steps in such manufacture thereof.

Referring now to FIG. 1, a substrate 10 is provided. As shown, the substrate is a semiconductor substrate comprising of, for example, silicon with an epitaxial layer formed in an upper surface portion thereof. Illustratively, the substrate 10 includes a doped region 12 formed therein to provide a drain or source region for a transistor. The transistor, for example, is the transistor of a memory cell in a memory device.

A dielectric layer 14 is formed over the upper surface of the substrate 10. The dielectric layer, for example, comprises silicon dioxide or other dielectric material. In one embodiment, the silicon dioxide layer 14 is formed by low pressure chemical vapor deposition (LPCVD). The thickness of the silicon dioxide layer is between about 2,000 Å to 10,000 Å. In an exemplary embodiment, the silicon dioxide layer is LPCVD at a temperature of about 800° C. and has a thickness is about 5,000 Å. Alternatively, the layer 14 may be formed by plasma enhanced chemical vapor deposition (PECVD) at a temperature of about 400° C.

A layer of photoresist is deposited over the upper surface of the dielectric layer 14. A mask (not shown) is used to expose portions of the photoresist with an exposure source from, for example, a conventional stepper lithography system. The photoresist layer is developed, removing portions exposed by the exposure source to produce structure 16. Alternatively, a negative photoresist layer is used. The use of a negative photoresist results in the unexposed portions being developed away.

Figure 2:
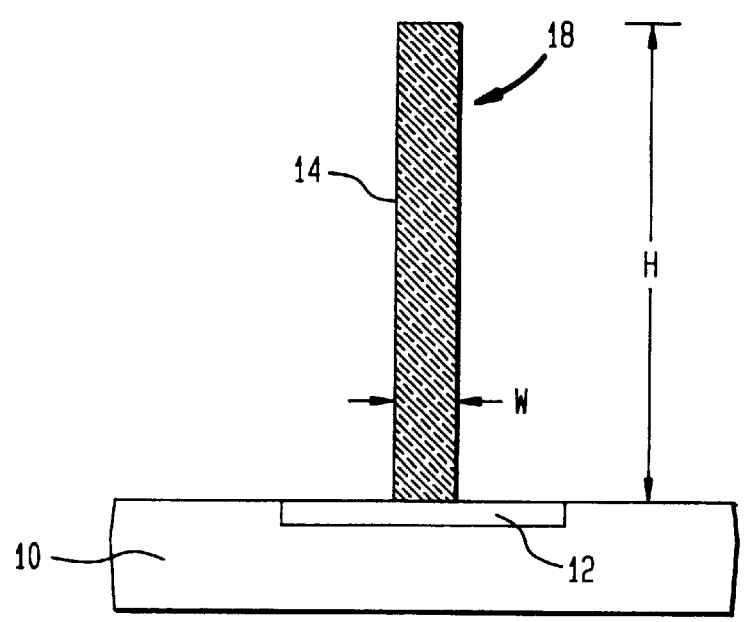

Referring to FIG. 2, portions of the dielectric layer exposed by the remaining photoresist layer 14 are anisotropically etched. The etch removes the dielectric layer 14 except the portion protected by the photoresist. In one embodiment, the photoresist is removed by reactive ion etching (RIE) employing a fluorine chemistry, such as $CF_4$, $CHF_3$, $C_4F_8$, or a combination thereof. As a result of the RIE, a vertically extending silicon dioxide column or post 18 is formed. The column 18 has a width W and a height H. The aspect ratio of the column 18 is therefore H/W. In an illustrative embodiment, the width of the column is less than 20 μm, preferably between about 0.2 μm to 5 μm, more preferably about 0.2 μm. The aspect ratio of the column is between about 2.5 to 3, preferably about 2.5.

Figure 3:
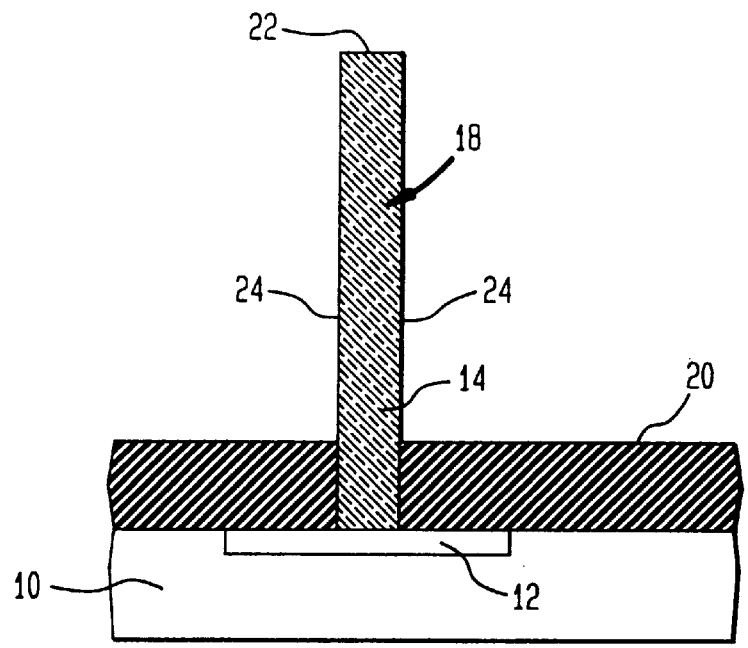

Referring to FIG. 3, a sacrificial flowable material is deposited over the substrate surface and column 18. The flowable material flows off the top surface 22 and sidewall portions 24 of the post 18 onto adjacent portions of the surface of the substrate 10, producing a layer 20.

In one embodiment, the flowable material of layer 20 is a flowable oxide comprising a hydrogensilsesquioxane glass (an undoped glass). The hydrogensilsesquioxane glass, for example, is manufactured and sold by Dow-Corning of Midland, Mich., as FOx-15. The flowable material is deposited by spinning such flowable material over the surface of the substrate.

After such material is spun-on deposited, the material is baked to form a silicon dioxide film. The flowable material is spun on to a thickness that is less than the height of the post 18. In one embodiment, the thickness of layer 20 is between about 300 Å to 4000 Å. During the bake process, the flowable oxide flows off topographical steps with widths less than 20 μm as well as heights larger than the flowable oxide thickness and fills in the space between such features homogeneously (i.e., the resulting layer is "self-leveled" or "self-planarized").

Figure 4:
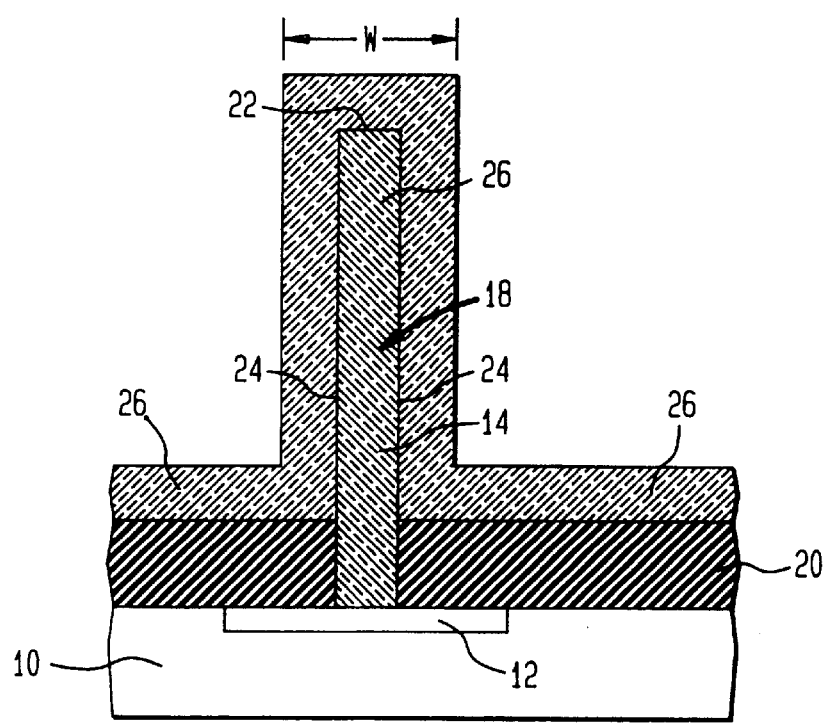

Referring to FIG. 4, a non-sacrificial layer 26 is deposited over the surface of the substrate. The non-sacrifical layer comprises, for example, dielectric material such as silicon dioxide. The silicon dioxide layer may be formed using the same process used to form the dielectric layer of the column 18. In one embodiment, the non-sacrificial material is deposited using a LPCVD at a temperature of about 800° C. and has a thickness of about 500 Å. As shown, the silicon dioxide layer 26 is conformal. That is, the silicon dioxide layer 26 conforms to the underlying surface topography. As a result, the non-sacrificial material layer 26, i.,e., silicon dioxide, is deposited over the sacrificial material layer 20 and over the sidewall portions 24 and the top surface 22 of the post 28, producing the structure shown in FIG. 4. In another embodiment, the width W' of the non-sacrificial layer over the post 18 is less than about 20 μm, preferably W' is less than about 1.5 μm.

The FOx-15 type material in layer 20 is able to endure annealing temperatures up to about 850° C. As previously described, the deposition temperature of layer 26 is about 800° C. As such, depositing the layer 26 concomitantly anneals layer 20. Although densification of the FOx-15 occurs to a certain degree due to loss of hydrogen at about 800° C., it will not dissolve. In addition, the FOx-15 has a significantly higher wet etching rate than that of LPCVD oxide, even after being subjected to temperatures of about 800° C. This allows the sacrificial layer to be removed by wet etch without etching the dielectric-material.

Figure 5:
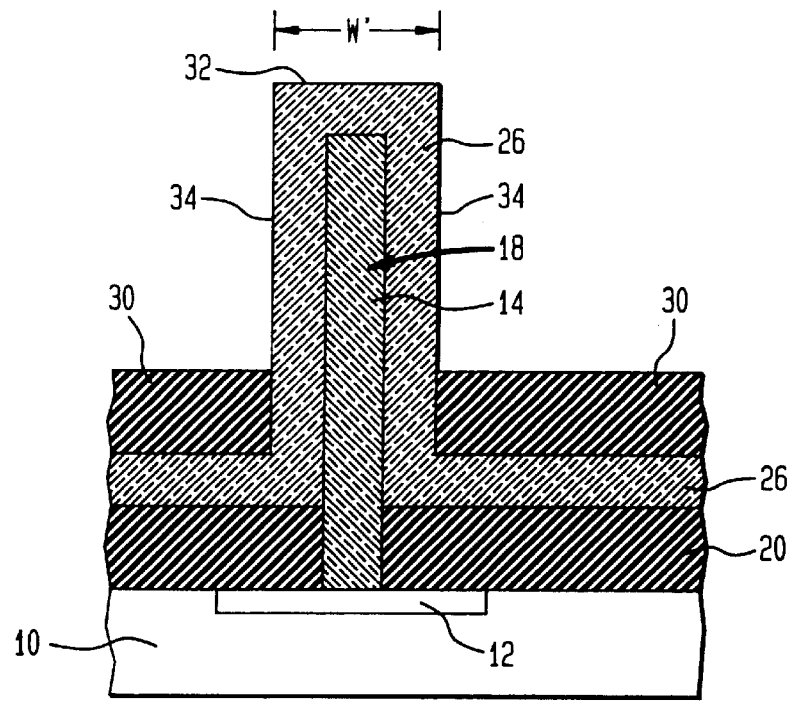
Figure 6:
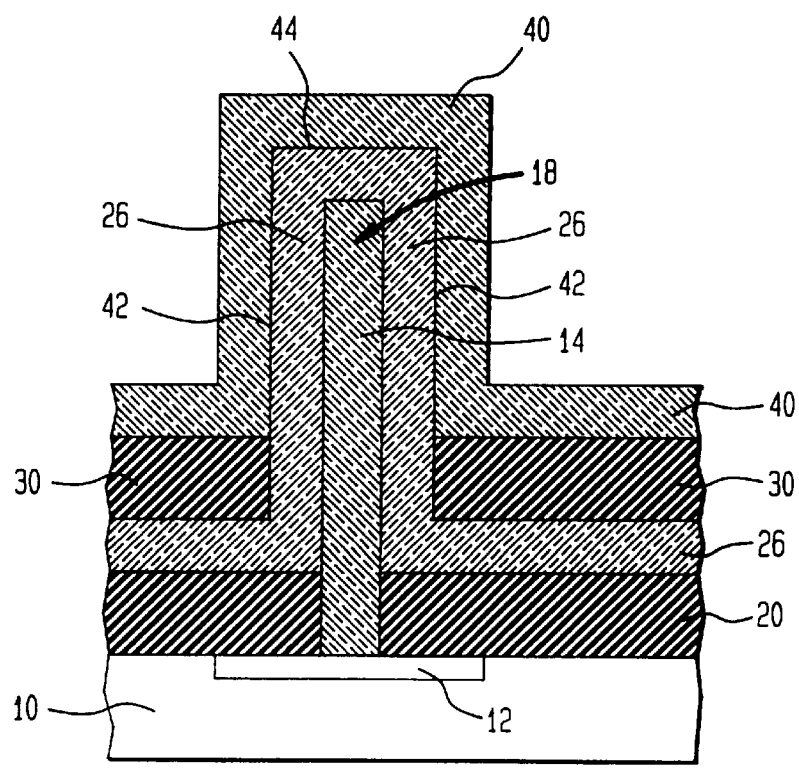

FIGS. 5 and 6 show the process described in FIGS. 3 and 4 being repeated. Referring to FIG. 5, the flowable, sacrificial material, such as hydrogensilsesquioxane glass, is deposited over the dielectric layer 26. The flowable material flows off the top surface 32 and sidewall portions 34 of the post 18 and onto adjacent portions of the surface of the dielectric layer 26 to form layer 30. After baking and curing, layer 30 becomes a silicon dioxide film.

Referring to FIG. 6, a non-sacrificial layer 40 is formed over the sacrificial layer 30 and over the sidewalls 42 and top 44 of the non-sacrificial material layer 26. Layer 40, as shown, is formed using the process described above in forming layer 26. The non-sacrificial material layer 40 is again silicon dioxide deposited by LPCVD to conform to the surface of the structure. In one embodiment, the deposition temperature of layer 40 is about 800° C. and has a thickness of about 500 Å.

Figure 7:
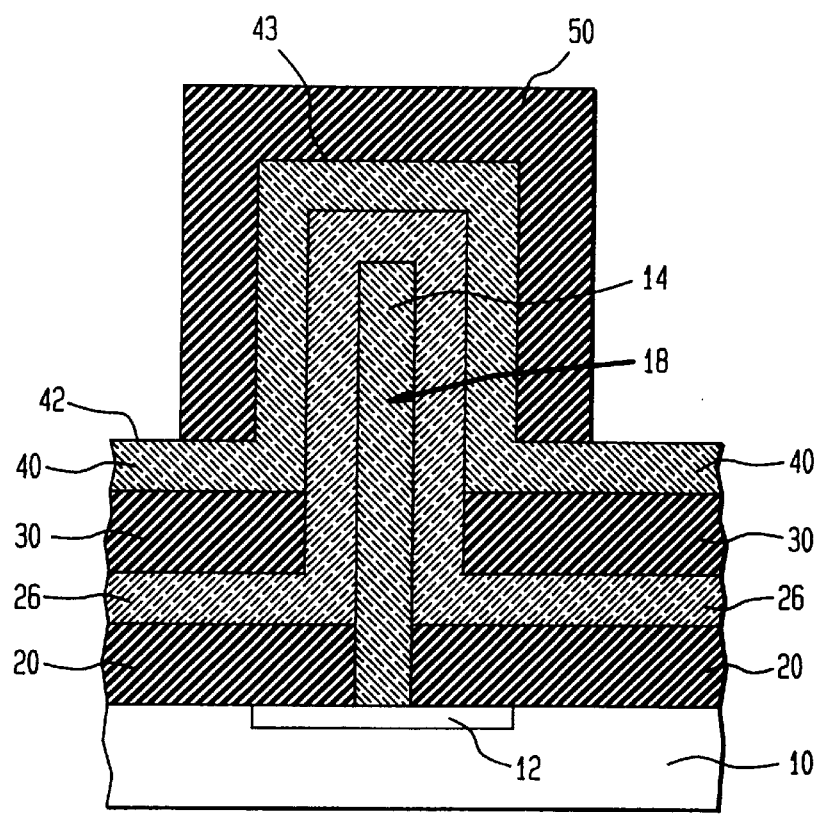

Referring to FIG. 7, a layer of 50 photoresist is deposited over the layer 40. Portions of the photoresist is selectively exposed and removed using the mask-light exposure-developing process described above. As shown, an unexposed portion of the photoresist remains. The remaining portion of the photoresist covers the non-planar portion 43 of layer 40 that protrudes above the planar portion 42 to produce the structure shown in FIG. 7. The portion of photoresist remaining defines the overall dimensions of microstructure which is to be formed.

Figure 8:
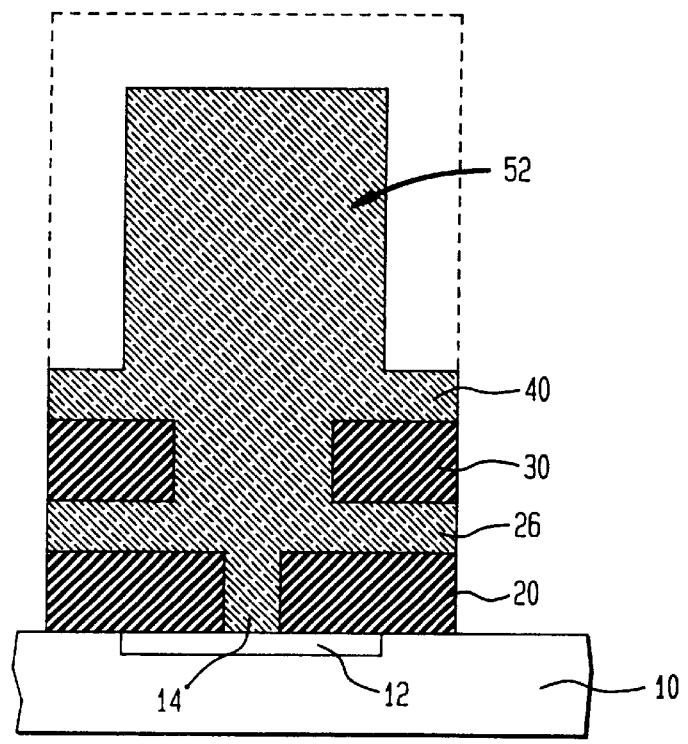

Referring to FIG. 8, a RIE is performed, removing portions of the various layers that are unprotected by the photoresist. The RIE results in layers 18, 26, and 40 being a vertically extending structure 52. In one embodiment, the RIE is performed using a dry etch comprising a fluorine chemistry such as, for example, $CF_4$, $CHF_3$, $C_4F_8$, or a combination thereof. The photoresist layer is then removed.

Figure 9:
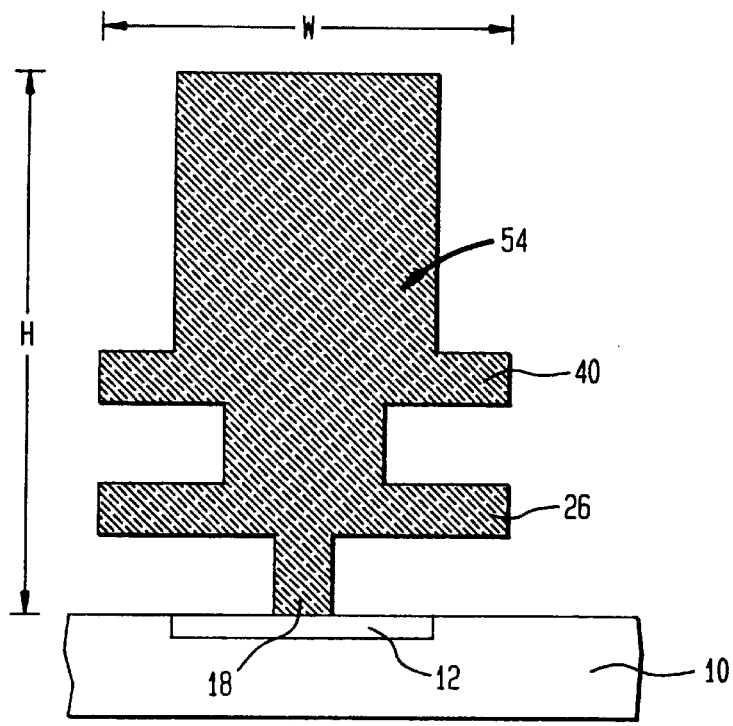

Referring to FIG. 9, a wet chemical etch is performed to remove the sacrificial layers. The wet ecth comprises, for example, dilute or buffered HF. It is noted that, the etch rate of the sacrificial materials of layers is about seven times higher than the etch rate of the silicon dioxide layers 18, 26 and 40. As such, the sacrificial layers are etched selective to the dielectric layers. The wet etch results in a vertically extending, dielectric structure 54 having a pair of upper and lower spaced horizontal members, i.e., layers 26, 40 provided by the non-sacrificial materials and with such horizontal members 26, 40. The horizontal members 26, 40 are supported a predetermined distance above the surface of the substrate 10 by a lower portion of the post 18. The predetermined distance is defined by the thickness of the sacrificial layers.

As can be seen from FIG. 9, the resulting structure is a vertically extending support structure 54 having a overall height h and width w. Since the structure is a cross section of a three dimensional sturcture, it has an overall length of l (not shown). Clearly, the surface area of structure 52 is greater than that of a cubic structure with the same overall h, w, and l.

Figure 10:
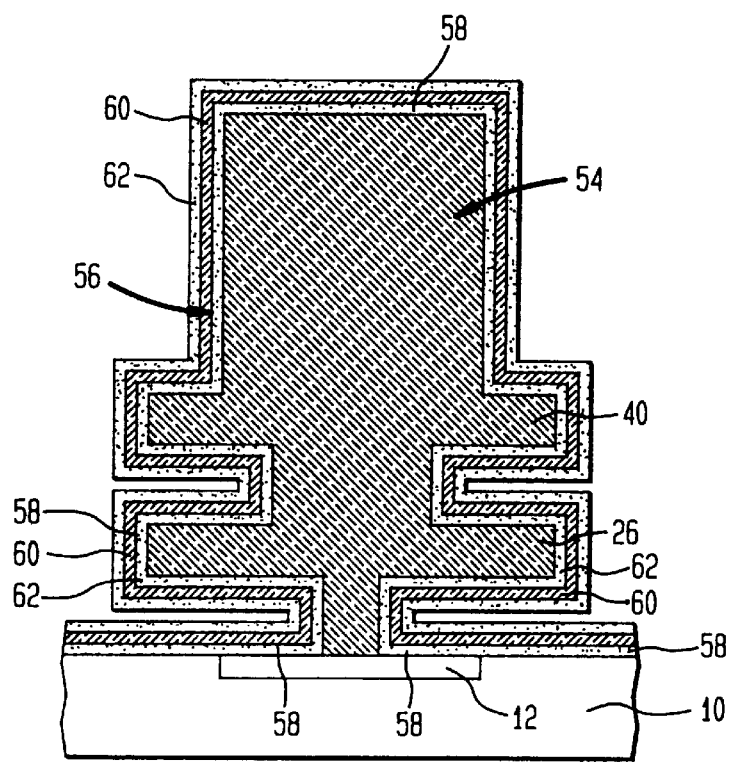

Referring to FIG. 10, a capacitor 56 is formed over the support structure 54. As shown, the capacitor 56 is formed by a series of depositions. Illustratively, a first conductive layer 58 is deposited over a surface of the support structure 54. The conductive layer, for example, comprises doped polycrystalline silicon deposited by LPCVD. The first conductive layer forms a first plate of the capacitor. A dielectric layer 60 is then deposited over the conductive layer 58. The dielectric layer comprises, for example, an oxide film, a nitride film, or a combination thereof. Alternatively, the dielectric layer comprises a material with a high dielectric constant (K), such as $Ta_2O_5$. In one embodiment, the dielectric layer is formed by is formed by LPCVD or by a rapid thermal process (RTP). A second conductive layer 62 is then formed over the dielectric layer 60. The second conductive layer comprises, for example, doped polycrystalline silicon formed by LPCVD. The second conductive layer forms a second plate of the capacitor. As such the two plates of the capacitor are separated by the dielectric layer.

As previously described, the support structure 54 has a greater surface area than that of a cubic structure having the same overall dimensions. Greater surface area advantageously enables a capacitor formed therefrom to have increased storage capacity.

It is noted that the post 18 is disposed over, and has a width less than the width of the doped region 12. Thus, the first conductive layer 58 is deposited onto the doped region 12 thereby electrically connecting the first conductive layer 58 to the DRAM source or drain region 12.

As described, the support structure 54 was formed by repeating the sequence of forming sacrifical and dielectric layers twice. In alternative embodiments, the support structure 54 may be formed by repeating the sequence more than twice. Also, forming the structure with one sequence is also useful.

Figure 11:
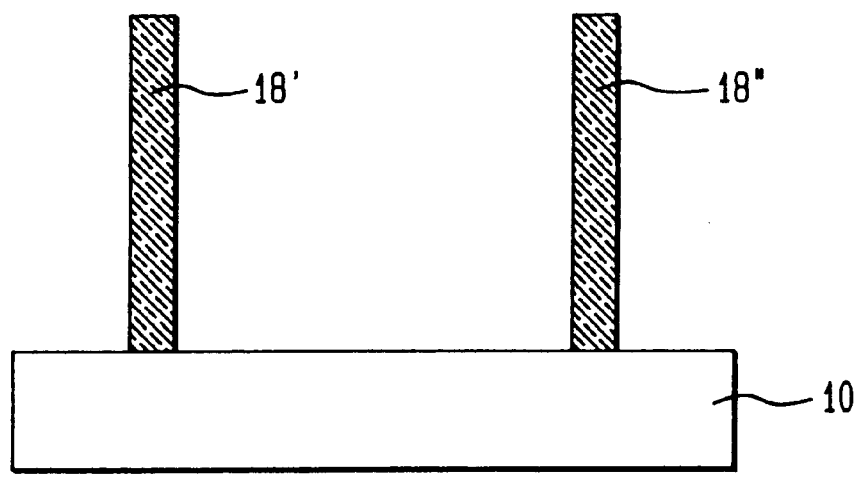
Figure 12:
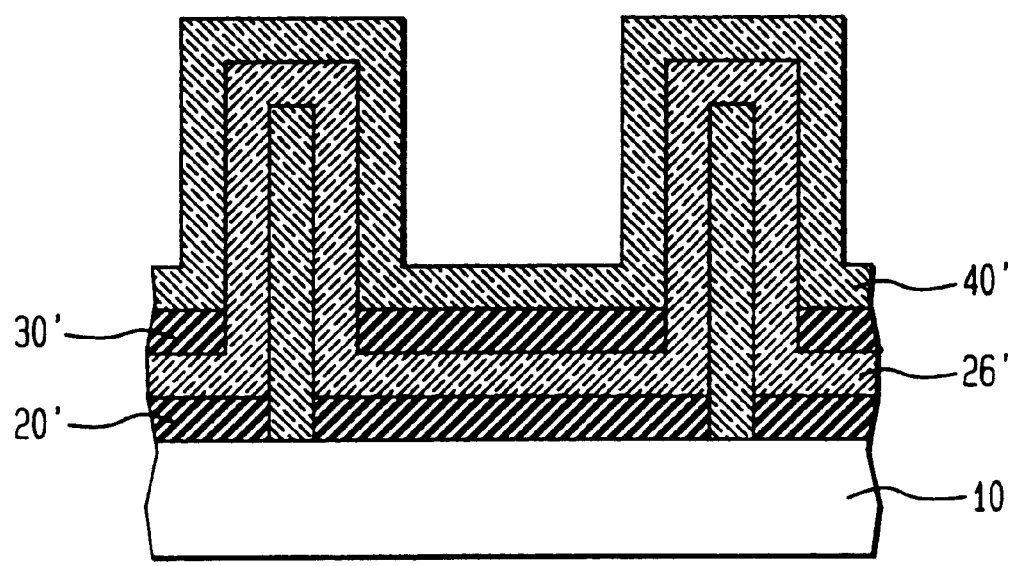
Figure 13:
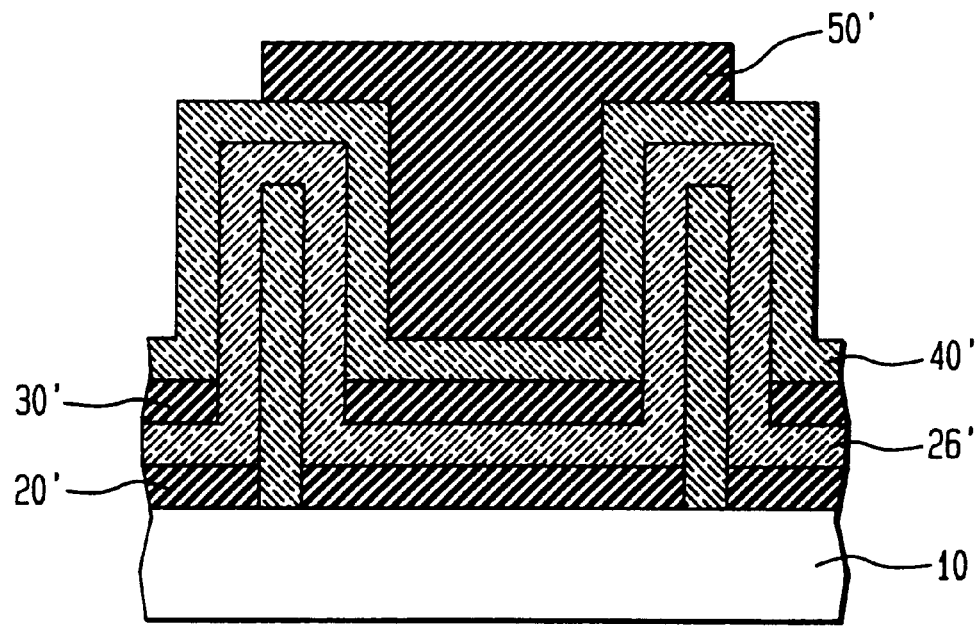
Figure 14:
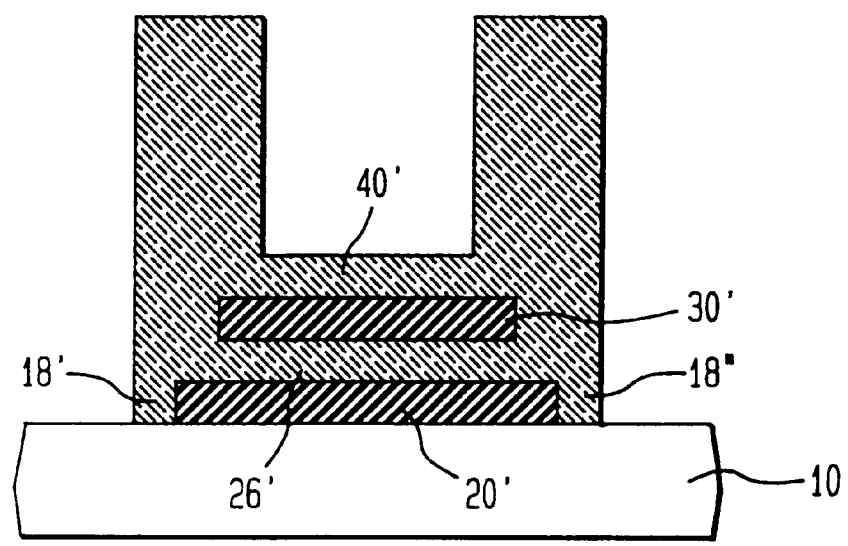
Figure 15:
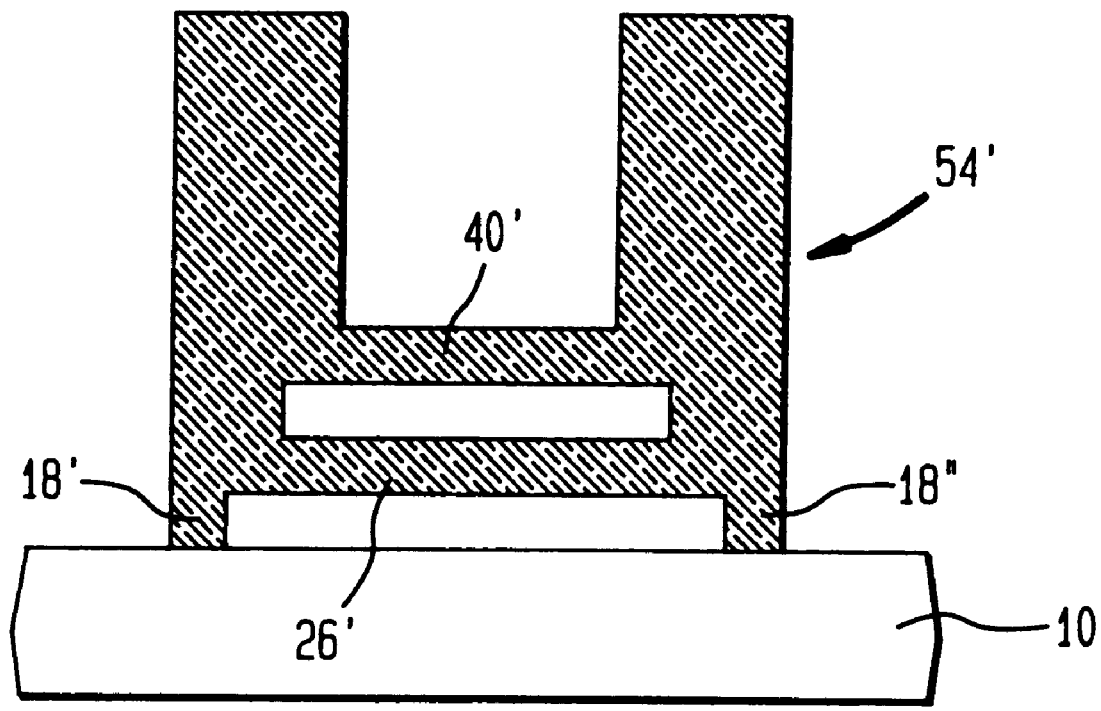

Referring now to FIG. 11, an alternative microstructure is shown. Here, a pair of laterally spaced dielectric posts 18', 18" is formed on the surface of substrate 10 using the photolithographic-etching techniques described above in connection with FIGS. 1 and 2. Each of the posts 18', 18" has a width less than 20 mm. Again, as shown in FIG. 12, an alternating sequence of sacrificial layers 20', 30' and dielectric layers 26', 40' are applied to the structures as they are formed. Again, the sacrificial layer material falls off the posts 18', 18" as described above. The resulting structure shown in FIG. 12 is patterned using photolithography, i.e., a photoresist mask 50', as shown in FIG. 13, to form the structure shown in FIG. 14. Next, the structure is placed in a wet chemical etch to remove the sacrificial layers 20', 30' while non-sacrificial silicon dioxide layers 26', 40' remain to provide the dielectric structure 54' shown in FIG. 15. The structure 54' may be used as a supporting structure for a capacitor, for example. In such case, a sequence of a conductive layer, dielectric layer, conductive layer depositions are applied to the surface of the support structure 54', as described above in connection with FIG. 10 thereby producing the capacitor shown in FIG. 12.

Thus, with the processes described above, a microstructure is formed with only two photolithographic steps; i.e., the step used to form the post, or posts, and the step to form the final dielectric microstructure. Further, the structure is a dielectric structure suitable for a wide range of applications.

While the invention has been particularly shown and described with reference to various embodiments, it will be recognized by those skilled in the art that modifications and changes may be made to the present invention without departing from its scope. Merely by way of example, while a capacitor structure has been described, other silicon based microstructures are also useful. For example, the invention is applicable to form insulating microstructures. Further, while the FOx material has been used above, other self-leveling and temperature-resistant silica films with reduced density, for example, spun-on silica aerogel, may be used as sacrificial materials.

Still further, the sacrificial layer may be formed using a gaseous deposition process with similar flow properties as that obtained with the spun on glass material described above instead of using such spin deposited process. One such material which may be used with gaseous deposition is Flowfill material sold by PMT-Electrotech, Chatsworth, Calif. The scope of the invention should therefore be determined not with reference to the above description but with reference to the appended claims along with their full scope of equivalents.

What is claimed is:

1. A structure comprising:

(A) a substrate;

(B) a dielectric support structure disposed on, and extending vertically from, a surface of the substrate;

(C) a capacitor disposed on surface portions of the vertically extending support structure such capacitor comprising:

(i) a first conductive layer disposed over a surface of the dielectric support structure, a portion of such first conductive layer being making electrical contact with the substrate;

(ii) a dielectric layer disposed over the conductive layer, such dielectric layer providing a dielectric for the capacitor; and (iii) a second conductive layer disposed over the dielectric layer, such second conductive layer providing another electrode of the capacitor.

2. The structure recited in claim 1 including a doped region disposed in the substrate and wherein the first conductive layer is in electrical contact with the doped region.

3. The structure recited in claim 1 wherein the support structure comprises:

a vertically extending post disposed on a portion of a surface of the substrate;

a horizontal member supported a predetermined distance above the surface of the substrate a lower portion of the post.

4. The structure recited in claim 1 wherein the dielectric material is silicon dioxide.

5. The structure recited in claim 4 wherein the post has a bottom portion width less than 20 mm.

6. The structure recited in claim 5 including a second horizontal member supported above the first horizontal member a predetermined distance by the post.

7. The structure recited in claim 1 comprising additionally a doped region disposed in the substrate.

8. The structure recited in claim 7 wherein the first conductive layer is electrically connected to the doped region.

9. The structure recited in claim 8 wherein the post is disposed over the doped region.

* * * * *